United States Patent
Chang et al.

(10) Patent No.: US 8,252,650 B1
(45) Date of Patent: Aug. 28, 2012

(54) METHOD FOR FABRICATING CMOS TRANSISTOR

(75) Inventors: Feng-Yi Chang, Tainan (TW); Yi-Po Lin, Tainan (TW); Jiunn-Hsiung Liao, Tainan (TW); Shang-Yuan Tsai, Kaohsiung (TW); Chih-Wen Feng, Tainan (TW); Shui-Yen Lu, Hsinchu County (TW); Ching-Pin Hsu, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/092,151

(22) Filed: Apr. 22, 2011

(51) Int. Cl.
*H01L 21/8234* (2006.01)

(52) U.S. Cl. .................. 438/275; 438/637; 257/E21.575

(58) Field of Classification Search .................. 438/213; 257/E21.37, E21.4, E21.487, E21.536, E21.615
See application file for complete search history.

(56) References Cited

U.S. PATENT DOCUMENTS

| | | | | |
|---|---|---|---|---|
| 7,709,317 B2 * | 5/2010 | Yang et al. | .................... | 438/219 |
| 2007/0202688 A1 | 8/2007 | Chou | | |

OTHER PUBLICATIONS

Pei Yu Chou et al., "A novel method for thicker CESL(CONT etch stop layer) etch process", Invention disclosure, Jun. 25, 2005, p. 1-6.

* cited by examiner

*Primary Examiner* — Cheung Lee
(74) *Attorney, Agent, or Firm* — Winston Hsu; Scott Margo

(57) ABSTRACT

A method for fabricating MOS transistor includes the steps of: overlapping a second stress layer on an etching stop layer and a first stress layer at a boundary region of the substrate; forming a dielectric layer on the first stress layer and the second stress layer; performing a first etching process to partially remove the dielectric layer for exposing a portion of the second stress layer at the boundary region; performing a second etching process to partially remove the exposed portion of the second stress layer for exposing the etching stop layer; performing a third etching process to partially remove the exposed portion of the etching stop layer for exposing the first stress layer at the boundary region; and performing a fourth etching process partially remove the exposed portion of the first stress layer.

15 Claims, 3 Drawing Sheets

METHOD FOR FABRICATING CMOS TRANSISTOR

BACKGROUND OF THE INVENTION

1. Field of the Invention

The invention relates to a method for fabricating a complimentary metal-oxide semiconductor (CMOS) transistor.

2. Description of the Prior Art

More recently, dual liner techniques have been introduced in order to provide different stresses in P-type MOS devices with respect to N-type MOS devices. For example, a nitride liner of a first type is formed over PMOS transistor of a CMOS device, while a nitride liner of a second type is formed over the NMOS transistor of the CMOS device. More specifically, it has been discovered that the application of a compressive stress in a PMOS channel improves carrier mobility therein, while the application of a tensile stress in an NMOS channel improves carrier mobility therein. Thus, the first type nitride liner over the PMOS devices is formed in a manner so as to achieve a compressive stress, while the second type nitride liner over the NMOS devices is formed in a manner so as to achieve a tensile stress.

For such CMOS devices employing dual liners, the conventional approach has been to form the two different nitrides using separate lithographic patterning steps. In other words, for example, the first type nitride liner is formed over both PMOS and NMOS devices, with the portions of the first type nitride liner over the NMOS devices being thereafter patterned and removed. After an optional formation of an oxide layer, the second type nitride liner is formed over both regions, with a second patterning step being used to subsequently remove the portions of the second type nitride liner over the PMOS devices. Unfortunately, due to inherent inaccuracies associated with aligning lithographic levels to previous levels, the formation of the two liners could result in an underlap therebetween.

In particular, the two liners could be formed in a manner such that one liner overlaps the other in a boundary region between the NMOS region and the PMOS region. In fact, the reticles used for the two separate patterning steps are typically designed to ensure an overlap such that there is no gap between the two liner materials.

SUMMARY OF THE INVENTION

It is an objective of the present invention to provide a method for fabricating CMOS transistor for resolving the aforementioned issues.

According to a preferred embodiment of the present invention, a method for fabricating a metal-oxide semiconductor transistor is disclosed. The method includes the steps of: providing a substrate having an active region and a boundary region; forming a first transistor and a second transistor on the active region of the substrate; forming a first stress layer and an etching stop layer on the first transistor and a second stress layer on the second transistor, wherein the second stress layer overlaps the etching stop layer and the first stress layer at the boundary region of the substrate; forming a dielectric layer on the first stress layer and the second stress layer; performing a first etching process to partially remove the dielectric layer for exposing a portion of the second stress layer at the boundary region; performing a second etching process to partially remove the exposed portion of the second stress layer for exposing the etching stop layer; performing a third etching process to partially remove the exposed portion of the etching stop layer for exposing the first stress layer at the boundary region; and performing a fourth etching process partially remove the exposed portion of the first stress layer.

These and other objectives of the present invention will no doubt become obvious to those of ordinary skill in the art after reading the following detailed description of the preferred embodiment that is illustrated in the various figures and drawings.

DETAILED DESCRIPTION

Despite two liner schemes are typically employed in current CMOS transistor fabrication, having certain regions with overlapping nitride liners creates other problems with subsequent processing due to issues such as reliability and layout inefficiencies. For example, a reactive ion etch (RIE) process for subsequent contact formation may have to accommodate for a single-thickness liner in some areas of the circuit, while also accommodating for a double-thickness (overlapping) liner in the interface areas. Moreover, if such overlapping areas are excluded from contact formation, a restriction results in terms of available layout area and critical dimension (CD) tolerances. The overlap will also cause problems during subsequent etching of holes for metal contacts since, during the etching, all of silicide will be over etched except for the silicide under the overlap areas. This can increase sheet resistance and junction leakage of devices.

Accordingly, it would be desirable to be able to implement the formation of a dual liner CMOS device in a manner that issues such as over-etching silicides in the active region as a result of overlapping dual stress liner in the boundary region could be resolved.

Figure 1:
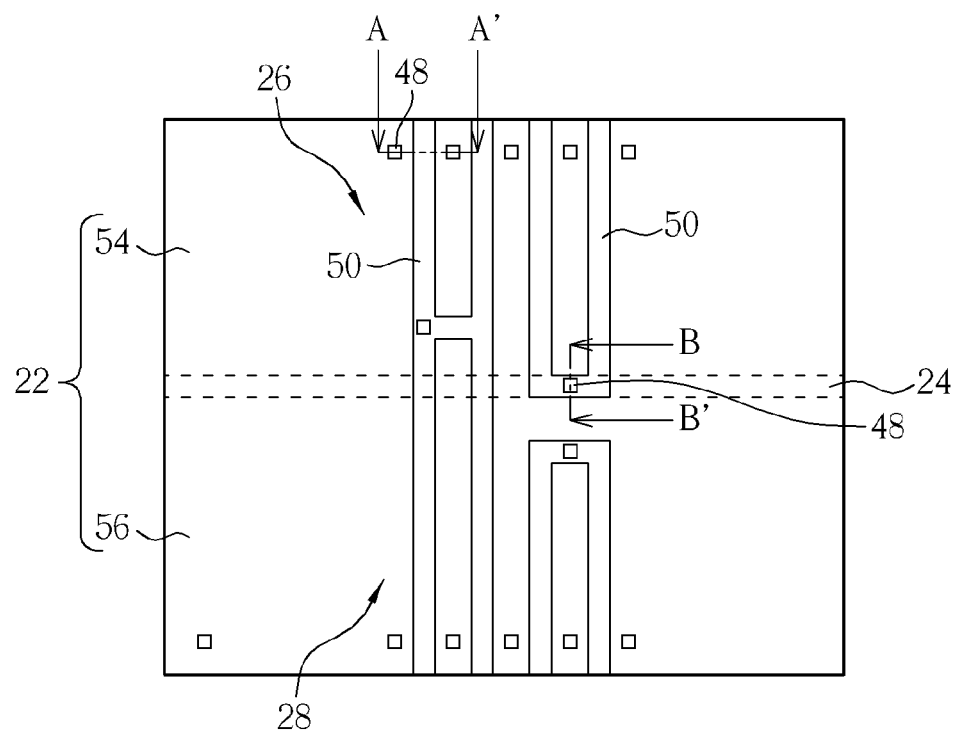
FIGS. 1-6 illustrate a method for fabricating a complimentary metal-oxide semiconductor (CMOS) transistor according to a preferred embodiment of the present invention.

Referring to FIGS. 1-6, FIGS. 1-6 illustrate a method for fabricating a complimentary metal-oxide semiconductor (CMOS) transistor according to a preferred embodiment of the present invention. Preferably, FIG. 1 depicts a top view of the layout of the CMOS transistor while FIGS. 2-6 illustrate cross-sectional views of the CMOS transistor in both active and boundary region. In FIGS. 2-6, an active region of the CMOS transistor in revealed on the left hand side while a boundary region of the device is shown on the right hand side. For simplicity reason, only one MOS transistor of the CMOS structure is shown on the active region in FIGS. 2-6, in which the MOS transistor could be a NMOS transistor or a PMOS transistor.

Figure 2:
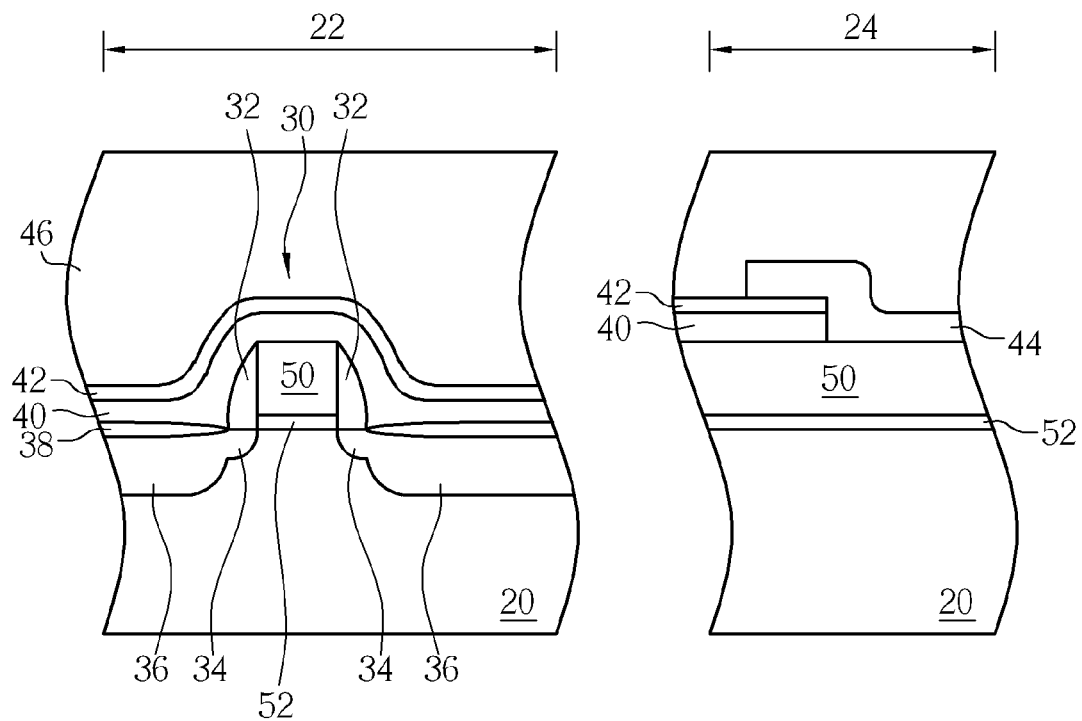

As shown in FIGS. 1-2, a substrate 20, such as a silicon substrate is first provided, and an active region 22 and a boundary region 24 are defined on the substrate 20. A first region 54 and a second region 56 may be further defined on the active region 22 of the substrate 20, and the boundary region 24 is preferably situated between the first region 54 and the second region 56. A first transistor 26 and a second transistor 28 are formed on the first region 54 and the second region 56 respectively, in which the first transistor 26 and the second transistor 28 may be separated by a shallow trench isolation (STI) (not shown).

In this embodiment, the first region 54 is a NMOS region and the second region 56 is a PMOS region, while the first transistor 26 formed on the first region 54 is a NMOS transistor and the second transistor 28 formed on the second region 56 is a PMOS transistor, but not limited thereto.

Each of the first transistor 26 and the second transistor 28 may include typical MOS structures such as a gate structure 30, a spacer 32 around the gate structure 30, a lightly doped drain 34 and a source/drain region 36 disposed in the substrate 20 adjacent to two sides of the gate structure 30, and a salicide layer 38 formed on the source/drain region 36. The gate structure 30 preferably includes a polysilicon gate 50 and a gate insulating layer 52 underneath. As these structures are well known to those skilled in the art, the details of which are omitted herein for the sake of brevity. After the first transistor 26 and the second transistor 28 are formed, a dual stress liner including a tensile stress layer and a compressive stress layer, and an etching stop layer are formed on the first transistor 26 and the second transistor 28 respectively.

The formation of the dual stress layers and the etching stop layer may be accomplished by first depositing a first stress layer 40, such as a silicon nitride tensile stress layer over both the first transistor 26 and the second transistor 28. Portions of the first stress layer 40 are then patterned and removed to expose the second transistor 28. After an etching stop layer 42 preferably composed of silicon oxide is deposited on the first stress layer 40, a second stress layer 44, such as a silicon nitride compressive stress layer is formed over both the first transistor 26 and the second transistor 28, with a second patterning step being used to subsequently remove portions of the second stress layer 44 over the first transistor 26. Alternatively, after the first stress layer 40 is patterned, the second stress layer 44 could be deposited on top of both the first transistor 26 and the second transistor 28 without performing any patterning process thereof to form two stress layers 40 and 44 on top of the first transistor 26 while only one stress layer 44 is formed on top of the second transistor 28, which is also within the scope of the present invention.

Consequently, a portion of the second stress layer 44 overlapping a portion of the etching stop layer 42 and the first stress layer 40 is observed in the boundary region 24 of the CMOS transistor, as shown in FIG. 2, in which the overlapped portion of the three layers 40, 42, 44 is preferably disposed on the same polysilicon gate 50 used to form the gate structure 30 in the active region 22. It should be noted that even though the stress layers 40 and 44 are overlapped on the polysilicon gate 50, the two stress layers 40 and 44 could also be overlapped directly on the substrate 20, which is also within the scope of the present invention. In either case, salicides could be formed on the surface of the polysilicon gate 50 and/or the substrate 20 before the stress layers are deposited.

It should be noted that the order for forming the dual stress layers is not limited to the scheme disclosed in this embodiment. For instance, instead of stacking the second stress layer 44, such as a compressive stress layer on top of the first stress layer 40, such as a tensile stress layer, the compressive stress layer and the etching stop layer could be formed on the PMOS transistor before the tensile stress layer is formed, thereby resulting a structure of tensile stress layer overlapping a portion of the etching stop layer and the compressive stress layer, which is also within the scope of the present invention.

As shown in FIG. 2, the active region 22 of the CMOS transistor is revealed on the left hand side of the figure while the boundary region 24 of the CMOS transistor is revealed on the right hand side. Preferably, the active region 22 is represented by the cross-sectional line AA' from FIG. 1 while the boundary region 24 is represented by the cross-sectional line BB' from FIG. 1.

For simplicity reason, only one MOS transistor from the CMOS device is shown in the active region. The MOS transistor could be an NMOS transistor or a PMOS transistor, and a stress layer, such as a tensile stress layer for the NMOS transistor or a compressive stress layer for the PMOS transistor is disposed on the MOS transistor As shown in the figure, after the first stress layer 40 and the second stress layer 44 are deposited, an interlayer dielectric layer 46 preferably composed of silicon oxide is formed over the surface of the first transistor 26 and the second transistor 28 in both the active region 22 and the boundary region 24.

Figure 3:
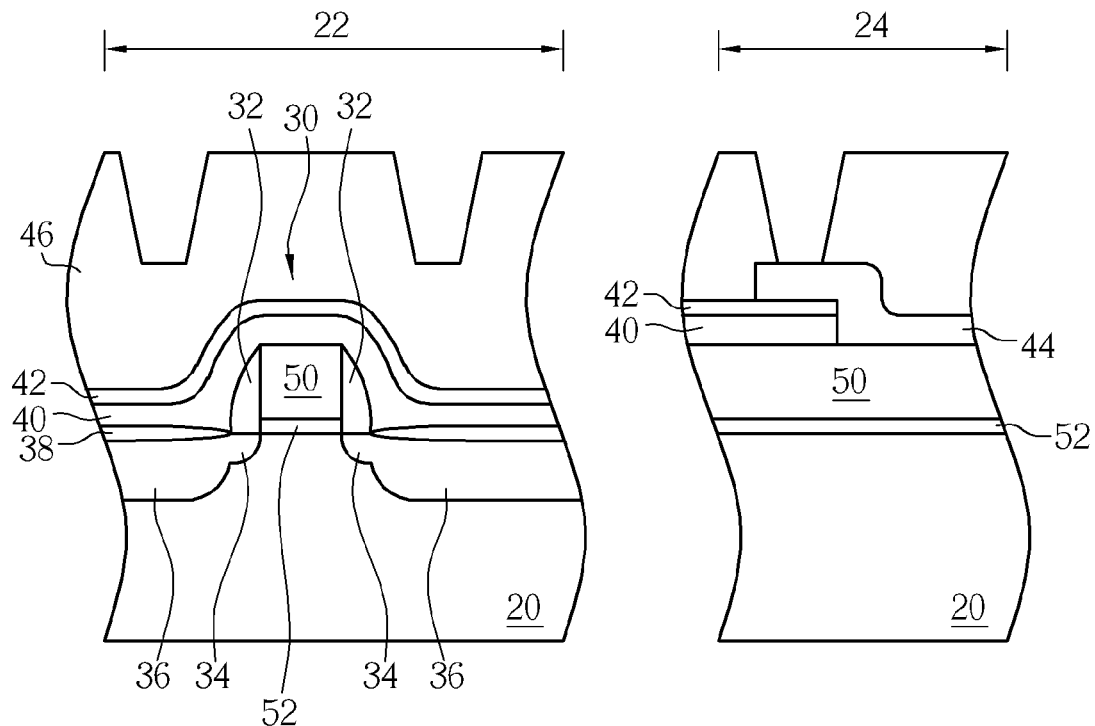

Next, a contact via formation is carried out in both the active region 22 and the boundary region 24. As shown in FIG. 3, a first etching process is performed by using $C_4F_6$ to partially remove the interlayer dielectric layer 46. This first etching process preferably stops on the second stress layer 44 probably with little second stress layer loss and exposes a portion of the second stress layer 44 at the boundary region 24. As the interlayer dielectric layer 46 at the boundary region 24 is removed, a portion of the interlayer dielectric layer 46 in the active region 22 is also removed simultaneously. It should be noted that no matter what selectivity is used between the layer being etched and the layer underneath, some loss could be found in the layer under the layer being etched, such as in the second stress layer 44 addressed above, and this phenomenon is commonly observed in all subsequent etching processes. Moreover, etching gases including argon, oxygen, or nitrogen gas could be applied to all etching processes addressed in the present invention.

Figure 4:
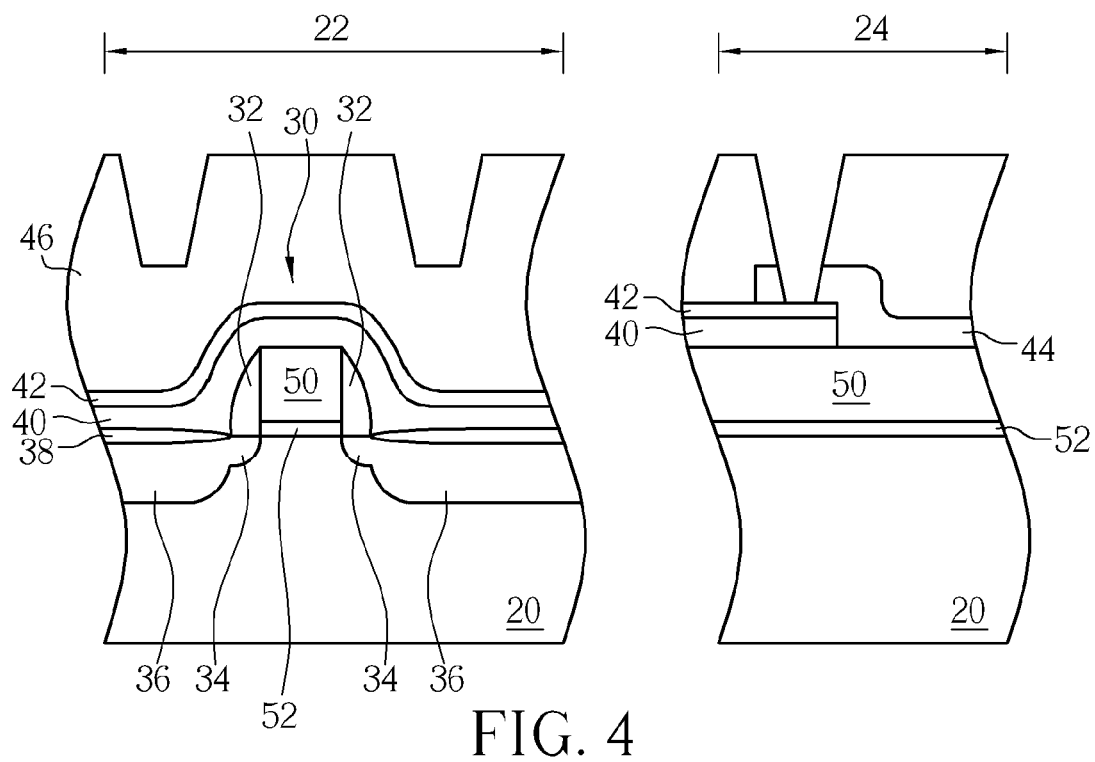

Next, as shown in FIG. 4, a second etching process is performed by using $CF_4$, $CHF_3$ or $CH_2F_2$ to partially remove the exposed portion of the second stress layer 44 in the boundary region 24. This second etching process preferably stops on the etching stop layer 42 probably with little etching stop layer loss 42 and expose the etching stop layer 42 underneath. The second stress layer 44 and the etching stop layer 42 preferably have a high selectivity therebetween. As the etching gas used in this etching step preferably targets material such as silicon nitride, the interlayer dielectric layer 46 in the active region 22 is unaffected.

Figure 5:
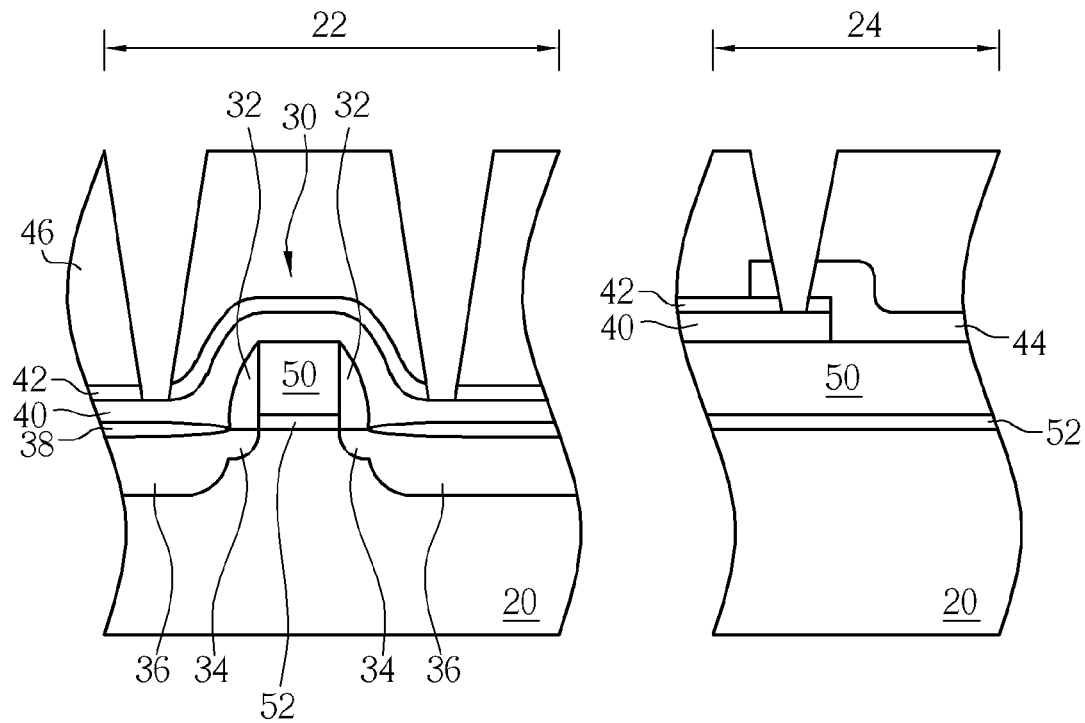

After a portion of the second stress layer 44 in the boundary region 24 is removed, as shown in FIG. 5, a third etching process is carried out by using $C_4F_6$ to partially remove the exposed portion of the etching stop layer 42. The third etching process preferably stops on the first stress layer 40 probably with little first stress layer 40 loss and exposes the first stress layer 40 underneath. As the etching stop layer 42 in both active region 22 and boundary region 24 and the interlayer dielectric layer 46 in the active region 22 are both composed of silicon oxide, part of etching stop layer 42 and the interlayer dielectric layer 46 that has been etched in the first etching process is further etched while the etching stop layer 42 in the boundary region 24 is removed. After part of the etching stop layer 42 in the boundary region 24 and part of the interlayer dielectric layer 46 and the etching stop layer 42 in the active region 22 are removed, the first stress layer 40 in both active region 22 and boundary region 24 is exposed.

Figure 6:
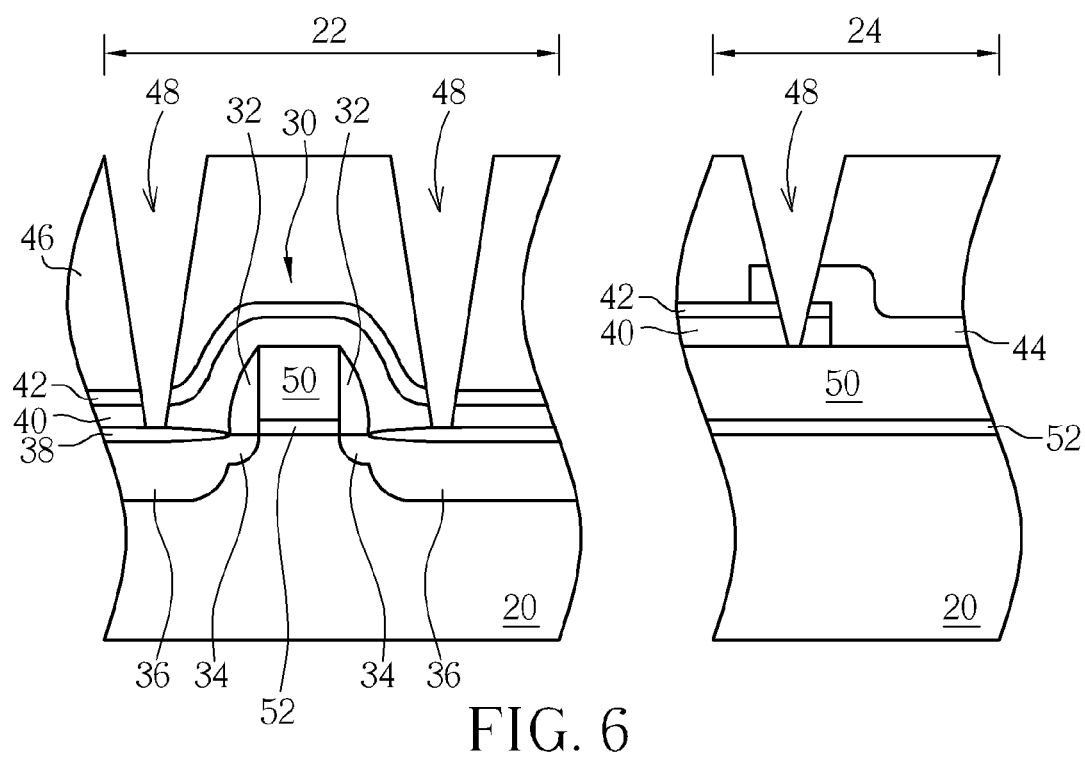

Next, as shown in FIG. 6, a fourth etching process is performed by using $CHF_3$ or $CH_2F_2$ to partially remove the exposed portion of the first stress layer 40 in both the boundary region 24 and the active region 22. This fourth etching process preferably stops on the salicide layer 38 of the active region 22 and the polysilicon layer 50 of the boundary region 24 and eventually forms a plurality of vias 48 in both regions. This completes the formation of vias in both active region 22 and boundary region 24 of the device, in which the vias 48 preferably penetrate through the interlayer dielectric layer 46, the second stress layer 44, the etching stop layer 42, and the first stress layer 40 in the boundary region 24. After the vias 48 are formed, metals such as tungsten could be deposited into the vias 48 to form a plurality of contact plugs in the active region 22 and the boundary region 24. Preferably, the aforementioned etching process could be conducted in the same etching chamber or in the same cluster tool.

Accordingly, by employing multiple etching processes in the boundary region of the CMOS device to etch through the dual stress layers and the etching stop layer therebetween, the present invention could successfully form desirable metal contact vias in the active region and boundary region of the CMOS device simultaneously. As the overlapped dual stress layers in the boundary region are fully etched through, issues such as over-etching silicides in the active region is also prevented substantially.

Those skilled in the art will readily observe that numerous modifications and alterations of the device and method may be made while retaining the teachings of the invention.

What is claimed is:

1. A method for fabricating a metal-oxide semiconductor transistor, comprising:
   providing a substrate having a first stress layer, an etching stop layer, and a second stress layer thereon, wherein the second stress layer partially overlaps the etching stop layer and the first stress layer;
   forming a dielectric layer on the first stress layer and the second stress layer;
   performing a first etching process to partially remove the dielectric layer for exposing a portion of the second stress layer;
   performing a second etching process to partially remove the exposed portion of the second stress layer for exposing the etching stop layer;
   performing a third etching process to partially remove the exposed portion of the etching stop layer for exposing the first stress layer; and
   performing a fourth etching process to partially remove the exposed portion of the first stress layer.

2. The method of claim 1, further comprising:
   providing the substrate having an active region and a boundary region;
   forming a first transistor and a second transistor on the active region of the substrate;
   forming the first stress layer and the etching stop layer on the first transistor and the second stress layer on the second transistor, wherein the second stress layer overlaps the etching stop layer and the first stress layer at the boundary region of the substrate;
   performing the first etching process to partially remove the dielectric layer for exposing a portion of the second stress layer at the boundary region;
   performing the second etching process to partially remove the exposed portion of the second stress layer for exposing the etching stop layer;
   performing the third etching process to partially remove the exposed portion of the etching stop layer for exposing the first stress layer at the boundary region; and
   performing the fourth etching process partially remove the exposed portion of the first stress layer.

3. The method of claim 2, further comprising performing the first etching process to partially remove the dielectric layer for exposing the portion of the second stress layer at the boundary region and partially remove the dielectric layer at the active region.

4. The method of claim 2, further comprising performing the third etching process to partially remove the exposed portion of the etching stop layer for exposing the first stress layer at the boundary region and partially remove the dielectric layer at the active region for exposing a portion of the first stress layer at the active region.

5. The method of claim 2, further comprising performing the fourth etching process to partially remove the exposed portion of the first stress layer at the boundary region and the active region.

6. The method of claim 2, wherein the first transistor comprises a NMOS transistor and the first stress layer comprises a tensile stress layer, and the second transistor comprises a PMOS transistor and the second stress layer comprises a compressive stress layer.

7. The method of claim 2, wherein the first transistor comprises a PMOS transistor and the first stress layer comprises a compressive stress layer, and the second transistor comprises a NMOS transistor and the second stress layer comprises a tensile stress layer.

8. The method of claim 1, further comprising utilizing $C_4F_6$ for performing the first etching process.

9. The method of claim 1, further comprising utilizing $CF_4$, $CHF_3$ or $CH_2F_2$ for performing the second etching process.

10. The method of claim 1, further comprising utilizing $C_4F_6$ for performing the third etching process.

11. The method of claim 1, further comprising utilizing $CH_3F$ or $CH_2F_2$ for performing the fourth etching process.

12. The method of claim 1, wherein the etching stop layer comprises silicon oxides.

13. The method of claim 1, wherein the dielectric layer comprises an interlayer dielectric layer.

14. The method of claim 1, wherein the first stress layer comprises a tensile stress layer and the second stress layer comprises a compressive stress layer.

15. The method of claim 1, wherein the first stress layer comprises a compressive stress layer and the second stress layer comprises a tensile stress layer.

* * * * *